(12) United States Patent
Imai

(10) Patent No.: US 10,123,469 B2
(45) Date of Patent: Nov. 6, 2018

(54) SUBSTRATE PROCESS SYSTEM, PROCESS PROCEDURE OPTIMIZATION PROGRAM, AND PROGRAM FOR DETERMINING NUMBER OF PROCESS MACHINES

(75) Inventor: Mitsuo Imai, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 400 days.

(21) Appl. No.: 14/425,395

(22) PCT Filed: Sep. 12, 2012

(86) PCT No.: PCT/JP2012/073278
§ 371 (c)(1),
(2), (4) Date: Mar. 3, 2015

(87) PCT Pub. No.: WO2014/041624
PCT Pub. Date: Mar. 20, 2014

(65) Prior Publication Data
US 2015/0216093 A1     Jul. 30, 2015

(51) Int. Cl.
*H05K 13/08* (2006.01)
*H05K 3/30* (2006.01)
*H05K 13/04* (2006.01)

(52) U.S. Cl.
CPC ............ *H05K 13/08* (2013.01); *H05K 3/303* (2013.01); *H05K 13/0404* (2013.01);
(Continued)

(58) Field of Classification Search
CPC .... H05K 3/303; H05K 13/04; H05K 13/0404; H05K 13/0408; H05K 13/0413;
(Continued)

(56) References Cited

U.S. PATENT DOCUMENTS 7,102,148 B2 *  9/2006  Kodama ............ H05K 13/0413
                                                   250/559.3
9,211,616 B2 * 12/2015  Kodama ................ B23P 21/00
(Continued)

FOREIGN PATENT DOCUMENTS

JP      2002-340813      11/2002
JP      2009-38340 A      2/2009
(Continued)

OTHER PUBLICATIONS

Extended European Search Report dated Sep. 12, 2016 in Patent Application No. 12884411.5.
(Continued)

*Primary Examiner* — A. Dexter Tugbang
*Assistant Examiner* — Joshua D Anderson
(74) *Attorney, Agent, or Firm* — Oblon, McClelland, Maier & Neustadt, L.L.P.

(57) ABSTRACT

A substrate process system which includes a plurality of arranged process machines, and in which a circuit substrate is transported from an upstream process machine to a downstream process machine is provided. One process machine inspects small electronic components, and another process machine 90 inspects large electronic components. The small mounted components are inspected in detail. When the large mounted components are inspected, it is not necessary to inspect the large electronic components in detail to the degree that the small electronic components are inspected. It is possible to reliably inspect the small mounted components even though the inspection process requires a certain length of time, and it is possible to inspect the large components in less detail than the inspection process for the small components. Accordingly, it is possible to reliably perform an inspection process, and to decrease an inspection time at the same time.

2 Claims, 9 Drawing Sheets

(52) U.S. Cl.
CPC ... *H05K 2203/163* (2013.01); *Y10T 29/49131* (2015.01); *Y10T 29/53174* (2015.01)

(58) Field of Classification Search
CPC ........... H05K 13/0452; H05K 13/0478; H05K 13/08; H05K 2203/163; Y10T 29/49131; Y10T 29/53043; Y10T 29/53174; Y10T 29/53178; Y10T 29/53187; Y10T 29/53191
See application file for complete search history.

(56) References Cited

U.S. PATENT DOCUMENTS

| | | | | |
|---|---|---|---|---|
| 2003/0027363 | A1* | 2/2003 | Kodama | G05B 19/4065 438/14 |
| 2004/0073322 | A1* | 4/2004 | Maenishi | H05K 13/0452 700/28 |
| 2006/0229758 | A1 | 10/2006 | Maenishi et al. | |
| 2010/0152877 | A1 | 6/2010 | Maenishi | |
| 2010/0189340 | A1 | 7/2010 | Ueda | |
| 2010/0249971 | A1 | 9/2010 | Maenishi et al. | |
| 2011/0184548 | A1* | 7/2011 | Higashi | H05K 13/0417 700/121 |

FOREIGN PATENT DOCUMENTS

| | | |
|---|---|---|
| JP | 2009-130134 | 6/2009 |
| JP | 2009-231808 | 10/2009 |
| JP | 2011-119430 | 6/2011 |

OTHER PUBLICATIONS

Office Action dated Oct. 4, 2016 in Japanese Patent Application No. 2014-535274.
Combined Office Action and Search Report dated Mar. 1, 2017 in Chinese Patent Application No. 201280075742.X (with English language translation and English translation of categories of cited documents).
International Search Report dated Oct. 23, 2012 in PCT/JP12/073278 Filed Sep. 12, 2012.

* cited by examiner

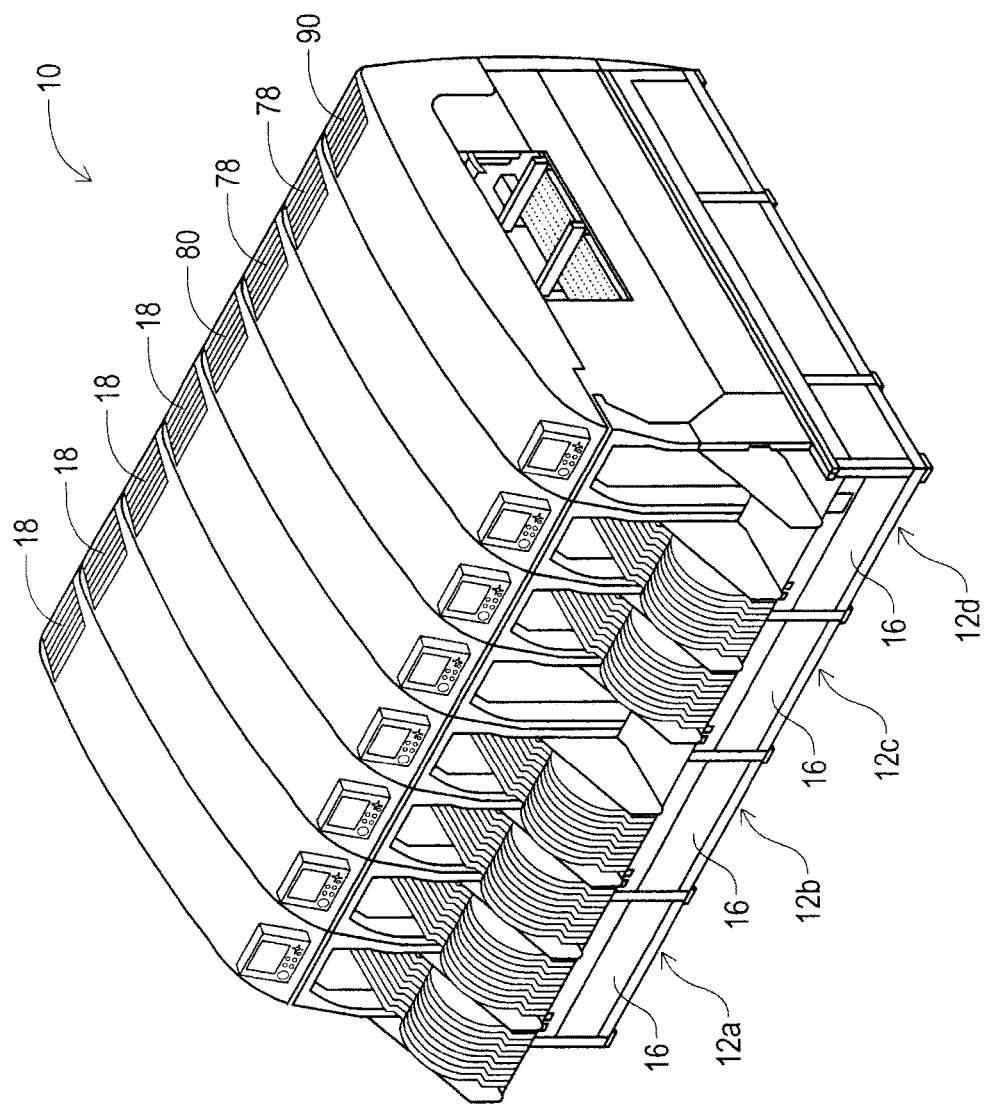
FIG. 1
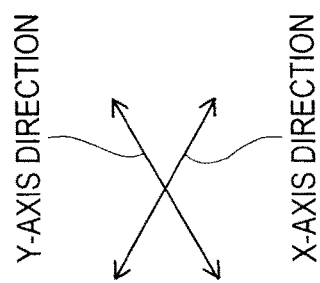

FIG. 9
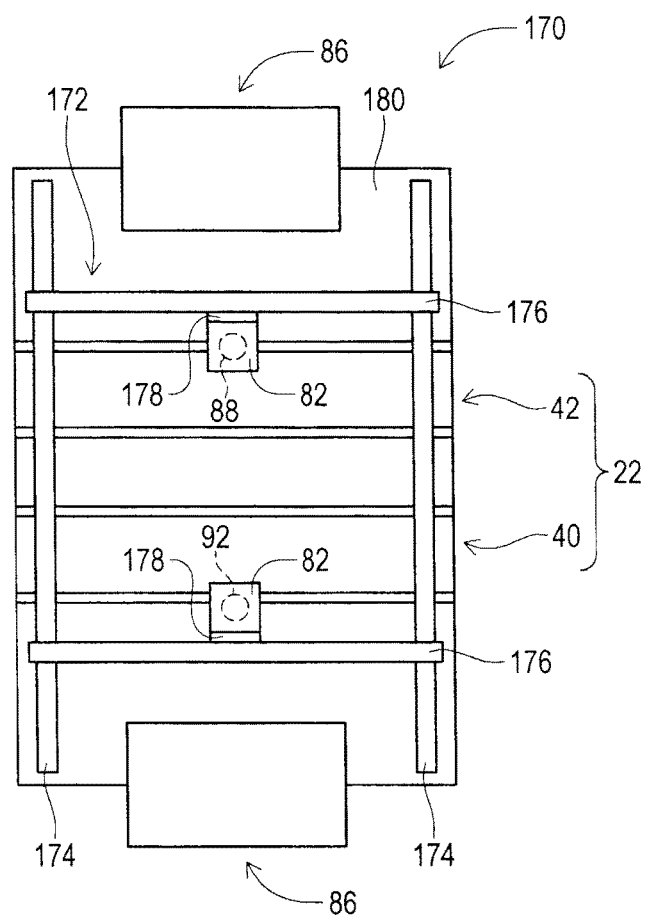
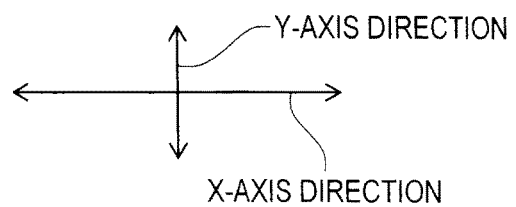

SUBSTRATE PROCESS SYSTEM, PROCESS PROCEDURE OPTIMIZATION PROGRAM, AND PROGRAM FOR DETERMINING NUMBER OF PROCESS MACHINES

TECHNICAL FIELD

The present disclosure relates to a substrate process system in which a circuit substrate being transported is sequentially processed, a program for optimizing a process procedure in the system, and a program for determining the number of process machines in the system.

BACKGROUND ART

Typically, a substrate process system includes a plurality of arranged process machines. A circuit substrate is transported from an upstream process machine to a downstream process machine among the plurality of process machines. The plurality of process machines include a mounting machine for mounting electronic components on the circuit substrate, and an inspection machine for inspecting the electronic components mounted on the circuit substrate. In such a system, preferably, the occurrence of defective products is prevented as much as possible, and preferably, an inspection process is reliably performed. In contrast, preferably, it does not take a long time for an inspection, and preferably, an inspection time is decreased. Taking these points into consideration, a substrate process system disclosed in the following patent literatures is provided with a plurality of inspection machines, and a circuit substrate is sequentially inspected by the plurality of inspection machines, and thereby, an inspection process is reliably performed, and at the same time, an inspection time is decreased.

PTL 1: JP-A-2011-119430
PTL 2: JP-A-2002-340813

DISCLOSURE

Technical Problem

In the substrate process system, a circuit substrate is sequentially inspected by the plurality of inspection machines, and thereby, it is possible to reliably perform an inspection process, and to decrease an inspection time at the same time. However, preferably, the inspection time is further decreased, and the inspection process is more reliably performed, and in the substrate process system, much room for improvement still remains. The present disclosure is made in light of these points, and an object of the present disclosure is to provide a substrate process system by which an inspection time is further decreased, and an inspection process is more reliably performed.

Solution to Problem

In order to solve the problems, one embodiment of a substrate process system is provided which is a substrate process system that includes a plurality of arranged process machines, and that processes a circuit substrate in such a manner that the circuit substrate is sequentially processed by the plurality of process machines while being transported from an upstream process machine to a downstream process machine among the plurality of process machines, in which the plurality of process machines have a plurality of inspection devices for inspecting processes of the circuit substrate, in which a first inspection device among the plurality of inspection devices inspects mounted components mounted on the circuit substrate, and a second inspection device among the plurality of inspection devices inspects mounted components larger than those inspected by the first inspection device.

In another embodiment of the substrate process system, the first inspection device has a resolving power higher than that of the second inspection device.

In another embodiment of the substrate process system, the plurality of process machines have a first mounting device for mounting the mounted components on the circuit substrate, and a second mounting device for mounting mounted components on the circuit substrate, which are larger than those mounted by the first mounting device, and the first inspection device is disposed on a downstream side of the first mounting device, the second mounting device is disposed on a downstream side of the first inspection device, and the second inspection device is disposed on a downstream side of the second mounting device.

One embodiment of a process procedure optimization program or device is a process procedure optimization program or device for optimizing a process procedure for each predetermined number of a plurality of arranged process machines in a substrate process system that includes the plurality of arranged process machines, and that processes a circuit substrate in such a manner that the circuit substrate is sequentially processed by the plurality of process machines while being transported from an upstream process machine to a downstream process machine among the plurality of process machines, in which the plurality of process machines have a plurality of inspection devices for inspecting processes of the circuit substrate, in which the program is executed to allocate a process to each of the plurality of process machines in such a manner that a first inspection device among the plurality of inspection devices inspects mounted components mounted on the circuit substrate, and a second inspection device among the plurality of inspection devices inspects mounted components larger than those inspected by the first inspection device.

One embodiment of a program or device for determining the number of process machines is a program or device for determining the number of process machines in a substrate process system that includes a plurality of the arranged process machines, and that processes a circuit substrate in such a manner that the circuit substrate is sequentially processed by the plurality of process machines while being transported from an upstream process machine to a downstream process machine among the plurality of process machines, in which the plurality of process machines have a plurality of inspection devices for inspecting processes of the circuit substrate, in which a first inspection device among the plurality of inspection devices inspects mounted components mounted on the circuit substrate, and a second inspection device among the plurality of inspection devices inspects mounted components larger than those inspected by the first inspection device, in which the program for determining the number of process machines is executed to determine the number of the plurality of process machines including the first inspection device and the second inspection device, depending on a takt time for each of the process machines.

Advantageous Effects

In one embodiment of the substrate process system, the first inspection device inspects the mounted components mounted on the circuit substrate, and the second inspection device inspects the mounted components larger than those inspected by the first inspection device. That is, relatively small mounted components are inspected by the first inspection device, and relatively large mounted components are inspected by the second inspection device. The small mounted components are preferably inspected in detail; however, when the detailed inspection is performed, an inspection process time increases. In contrast, when the large mounted components are inspected, it is not necessary to inspect the large electronic components in detail to the degree that the small electronic components are inspected. Taking this point into consideration, in one embodiment of the substrate process system, it is possible to reliably inspect the small mounted components even though the inspection process requires a certain length of time, and it is possible to inspect the large components in less detail than the inspection process for the small components. Accordingly, it is possible to reliably perform an inspection process for a small component, and to decrease an inspection time at the same time.

In another embodiment of the substrate process system, the first inspection device has a resolving power higher than that of the second inspection device. That is, it is possible to adopt an inspection device having a high resolving power as the first inspection device, and it is possible to adopt an inspection device having a resolving power lower than that of the first inspection device as the second inspection device. Accordingly, it is possible to inspect the small components in detail by inspecting the small electronic components via the first inspection device having a high resolving power. In contrast, the large electronic components are inspected by the second inspection device having a lower resolving power; however, since the inspection target components are large, it is possible to properly inspect the large target components. Since images are captured by the inspection device having a low resolving power, the time required for processing image data is relatively short, and thereby it is possible to reduce an inspection time. In addition, typically, since the inspection device having a low resolving power has a wide visual field, it is possible to inspect the electronic components with a smaller number of times of inspection processes. Accordingly, it is possible to further reduce an inspection time.

In another embodiment of the substrate process system, the small electronic components are mounted on the circuit substrate, and then the mounted small electronic components are inspected. After the inspection of the small electronic components is completed, the large electronic components are mounted on the circuit substrate. After the large electronic components are mounted, the inspection of the large electronic components is performed. That is, first, it is inspected whether the small electronic components are properly mounted, and then, the large electronic components are mounted. Accordingly, it is possible to reliably prevent a small electronic component from being placed below a large electronic component.

In one embodiment of the process procedure optimization program or device, the process procedure for each of the plurality of process machines is optimized by allocating the process to each of the plurality of process machines in such a manner that the first inspection device inspects the small electronic components, and the second inspection device inspects the large electronic components. Accordingly, it is possible to reliably inspect the small components, and it is possible to reduce an inspection time at the same time, and thereby it is possible to reduce a process time for the entirety of the system.

In one embodiment of the program or device for determining the number of process machines, the first inspection device inspects the small electronic components, and the second inspection device inspects the large electronic components, the program for determining the number of process machines is executed to determine the number of the plurality of process machines including the first inspection device and the second inspection device, depending on the takt time for each of the process machines. Accordingly, it is possible to reliably inspect the small components, and it is possible to reduce an inspection time at the same time, and thereby it is possible to realize a predetermined takt time.

BRIEF DESCRIPTION OF DRAWINGS

FIG. 1 is a perspective view illustrating a substrate process system that is an example of the present invention.

FIG. 9 is a top plan view of an inspection machine according to a modification example.

DESCRIPTION OF EMBODIMENTS

Figure 2:
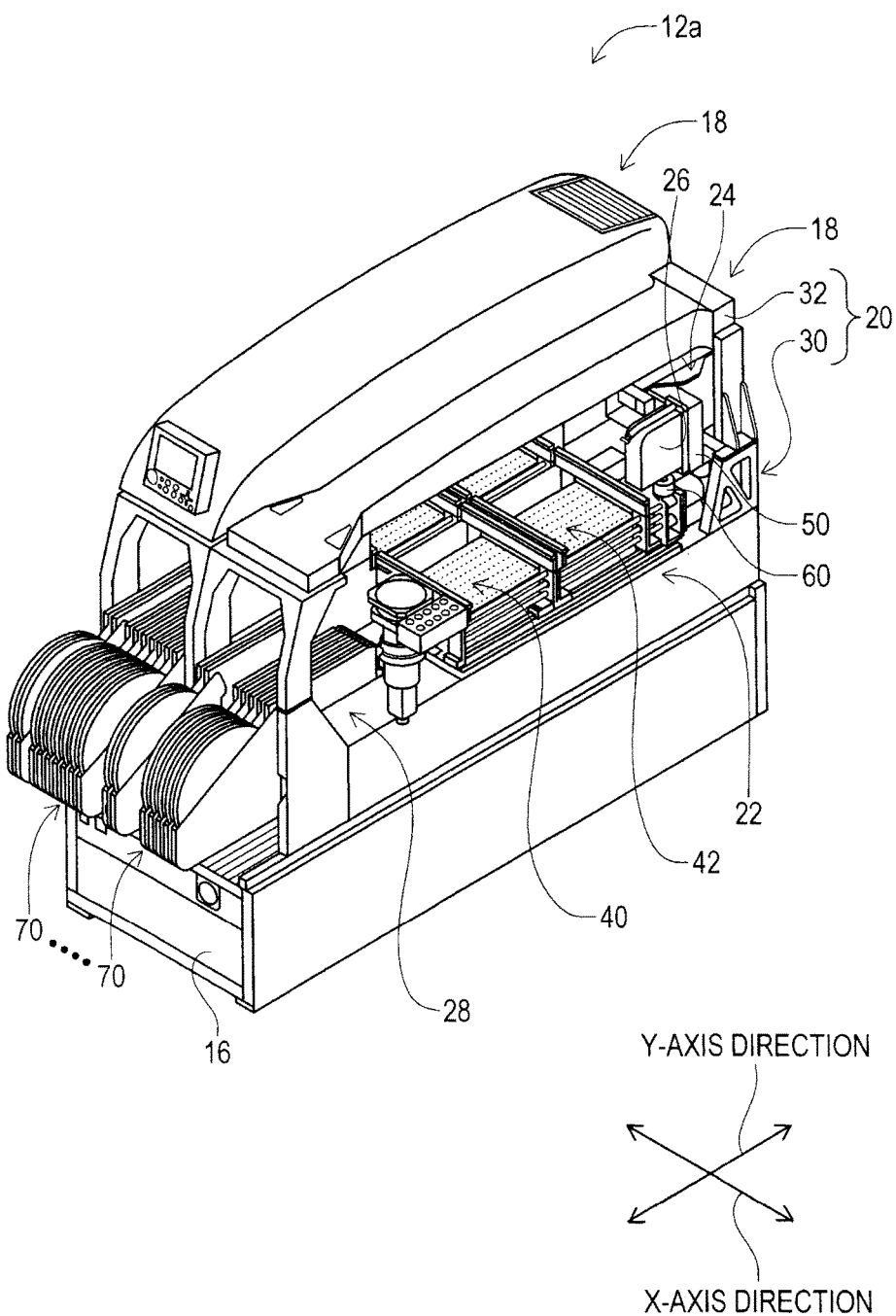
FIG. 2 is a perspective view illustrating a process apparatus of the substrate process system.

Hereinafter, an example and a modification example according to an embodiment of the present disclosure will be described in detail with reference to the accompanying drawings.

<Configuration of Substrate Process System>

FIG. 1 illustrates a substrate process system 10. The system 10 illustrated in FIG. 1 is a system for mounting electronic components on a circuit substrate. The substrate process system 10 is formed of four substrate process apparatuses (hereinafter, may be simply referred to as "process apparatuses") 12. The four process apparatuses 12 are provided in a row while being disposed adjacent to each other. In order to distinguish between the four process apparatuses 12, the four process apparatuses 12 are respectively referred to as a process apparatus 12a, a process apparatus 12b, a process apparatus 12c, and a process apparatus 12d which are sequentially disposed from the most upstream side to the most downstream side. An X-axis direction refers to the line-up direction of the process apparatuses 12, and a Y-axis direction refers to a horizontal direction orthogonal to the line-up direction.

Figure 3:
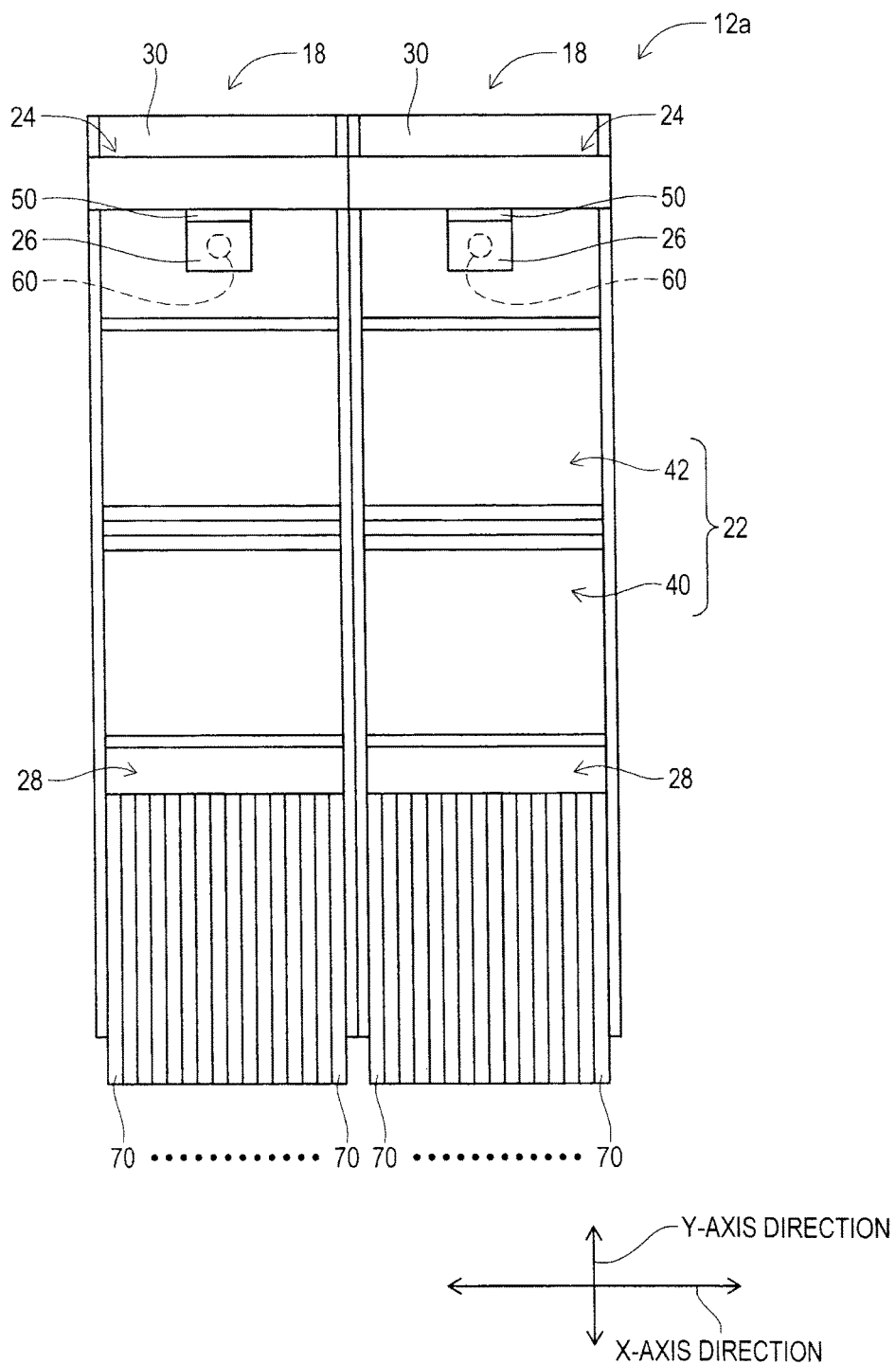
FIG. 3 is a top plan view illustrating the process apparatus formed of two mounting machines.

The process apparatus 12a and the process apparatus 12b have substantially the same configuration. For this reason, the process apparatus 12a will be representatively described. As illustrated in FIGS. 2 and 3, the process apparatus 12a has one system base 16, and two adjacent first mounting machines 18 on the system base 16. FIG. 2 is a perspective view of the process apparatus 12a, and FIG. 3 is a top plan view of the process apparatus 12a with a cover and the like removed.

Basically, the first mounting machine 18 includes a mounting machine main body 20; a transportation device 22; a mounting heat moving device (hereinafter, may be simply referred to as a "moving device") 24; a mounting head 26; and a supply device 28. The mounting machine main body 20 is formed of a frame portion 30, and a beam portion 32 that is suspended above the frame portion 30.

The transportation device 22 includes two conveyor devices 40 and 42. The two conveyor devices 40 and 42 are provided on the frame portion 30 in such a manner so as to be parallel with each other and to extend in the X-axis direction. The two conveyor devices 40 and 42 transport circuit substrates supported by the conveyor devices 40 and 42 in the X-axis direction, respectively, using an electromagnetic motor 46 (refer to FIG. 6). The circuit substrate is fixedly held at a predetermined position by a substrate holding device 48 (refer to FIG. 6).

The moving device 24 is an X-Y robot type of moving device. The moving device 24 includes an electromagnetic motor 52 (refer to FIG. 6) that slides a slider 50 in the X-axis direction and an electromagnetic motor 54 (refer to FIG. 6) that slides the slider 50 in the Y-axis direction. The mounting head 26 is attached to the slider 50, and the mounting head 26 moves to an arbitrary position on the frame portion 30 due to the operation of the two electromagnetic motors 52 and 54.

The mounting head 26 mounts electronic components on a circuit substrate. The mounting head 26 has a suction nozzle 60 provided on a lower end surface of the mounting head 26. The suction nozzle 60 communicates with a positive and negative pressure air supply device 62 (refer to FIG. 6) via a negative-pressure air passage and a positive-pressure air passage. The suction nozzle 60 suctions and holds an electronic component using a negative pressure, and releases a held electronic component using a positive pressure. The mounting head 26 has a nozzle elevation device 66 (refer to FIG. 6) that lifts the suction nozzle 60 up and down. The mounting head 26 changes the vertical position of a held electronic component using the nozzle elevation device 66.

The supply device 28 is a feeder type of supply device, and is provided in a front end portion of the frame portion 30. The supply device 28 has a tape feeder 70. The tape feeder 70 accommodates taped components in a rolled state. The taped components are electronic components which are taped. A feeding device 76 (refer to FIG. 6) feeds the taped components from the tape feeder 70. Accordingly, a feeder type of the supply device 28 supplies electronic components to the supply position by feeding the taped components. The tape feeder 70 of each of the process apparatuses 12a and 12b accommodates very small electronic components, specifically, electronic components, each of which has a side length in a range of 0.1 mm to 1.0 mm. That is, the supply device 28 of each of the process apparatuses 12a and 12b supplies very small electronic components.

Figure 4:
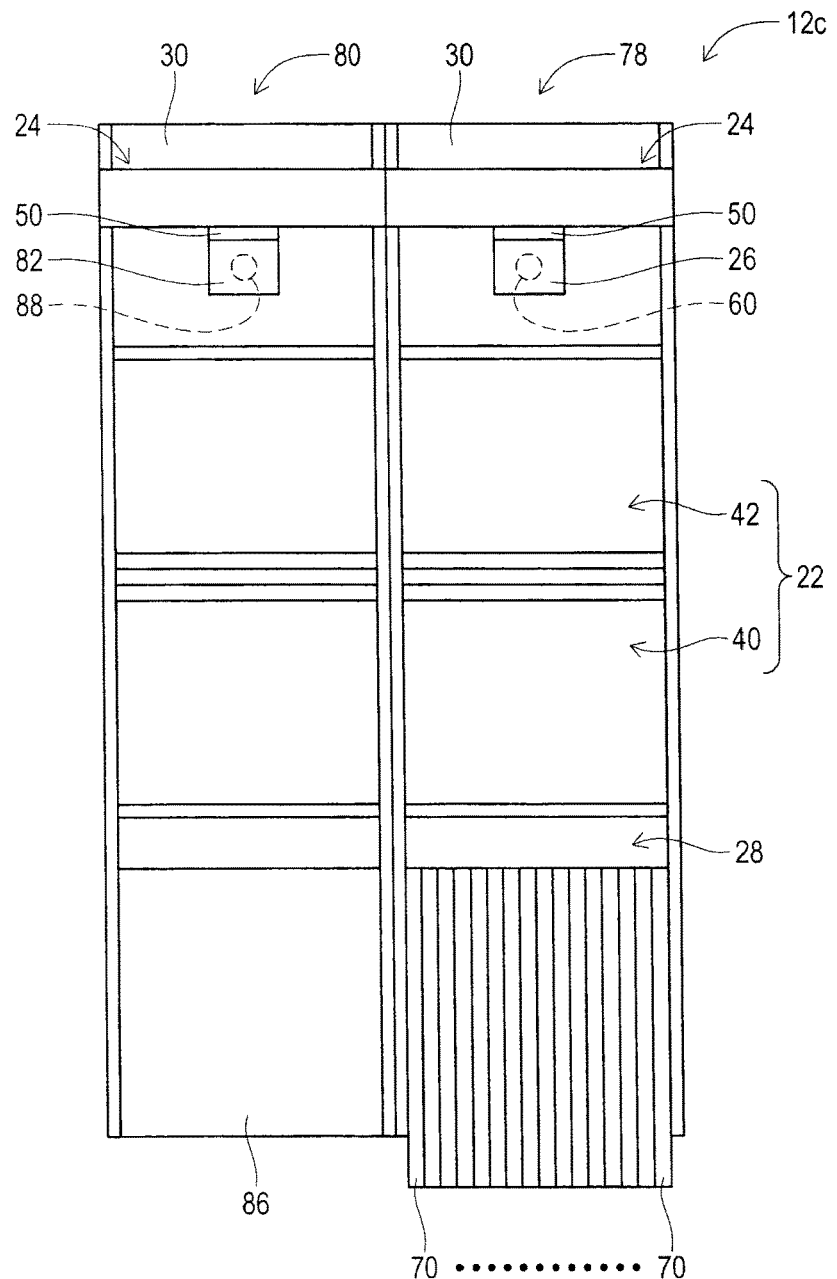
FIG. 4 is a top plan view illustrating the process apparatus formed of the mounting machine and a first inspection machine.

As illustrated in FIGS. 1 and 4, the process apparatus 12c has the system base 16; a second mounting machine 78; and a first inspection machine 80. The second mounting machine 78 and the first inspection machine 80 are provided on the system base 16 while being adjacent to each other, and the first inspection machine 80 is provided on an upstream side of the second mounting machine 78.

The second mounting machine 78 has the same configuration as the first mounting machine 18 of each of the process apparatuses 12a and 12b. The tape feeder 70 of the second mounting machine 78 accommodates electronic components larger than those accommodated in the tape feeder 70 of the first mounting machine 18, specifically, electronic components, each of which has a side length in a range of 5 mm to 30 mm. That is, the supply device 28 of the second mounting machine 78 supplies electronic components larger than those that are supplied by the supply device 28 of the first mounting machine 18.

Except for the mounting head 26 and the supply device 28, the first inspection machine 80 has substantially the same structure as that of each of the first mounting machine 18 and the second mounting machine 78. Specifically, in the first inspection machine 80, the mounting head 26 is detached from the slider 50, and instead of the mounting head 26, an inspection head 82 is attached to the slider 50. In addition, in the first inspection machine 80, the supply device 28 is detached from the frame portion 30, and instead of the supply device 28, an image process device 86 is attached to the frame portion 30. That is, the first inspection machine 80 is formed of the transportation device 22; the moving device 24; the inspection head 82; and the image process device 86.

As such, it is possible to transform each of the mounting machines 18 and 78 into the first inspection machine 80 by replacing the mounting head 26 of each of the mounting machines 18 and 78 with the inspection head 82 and by replacing the supply device 28 with the image process device 86. Accordingly, it is possible to transform each of the mounting machines 18 and 78 and the inspection machine 80 of the substrate process system 10 whenever necessary, and it is possible to freely rearrange a line configuration of the system.

The inspection head 82 has a first inspection camera 88. The first inspection camera 88 is attached to a lower surface of the inspection head 82 while facing downward. The first inspection camera 88 captures a top view image of a circuit substrate. Image data of the first inspection camera 88 is processed by the image process device 86, and thereby information relative to electronic components mounted on a circuit substrate is acquired. Specifically, the following information is acquired: position of an electronic component mounted on a circuit substrate; existence and non-existence of an electronic component; mounting direction (polarity) of an electronic component; existence and non-existence of foreign matters; and the like. Accordingly, the first inspection machine 80 inspects electronic components mounted on a circuit substrate. The first inspection camera 88 is a high-pixel and high-resolution camera, and has a high resolving power; however, a visual field, that is, an imaging range is relatively narrow.

Figure 5:
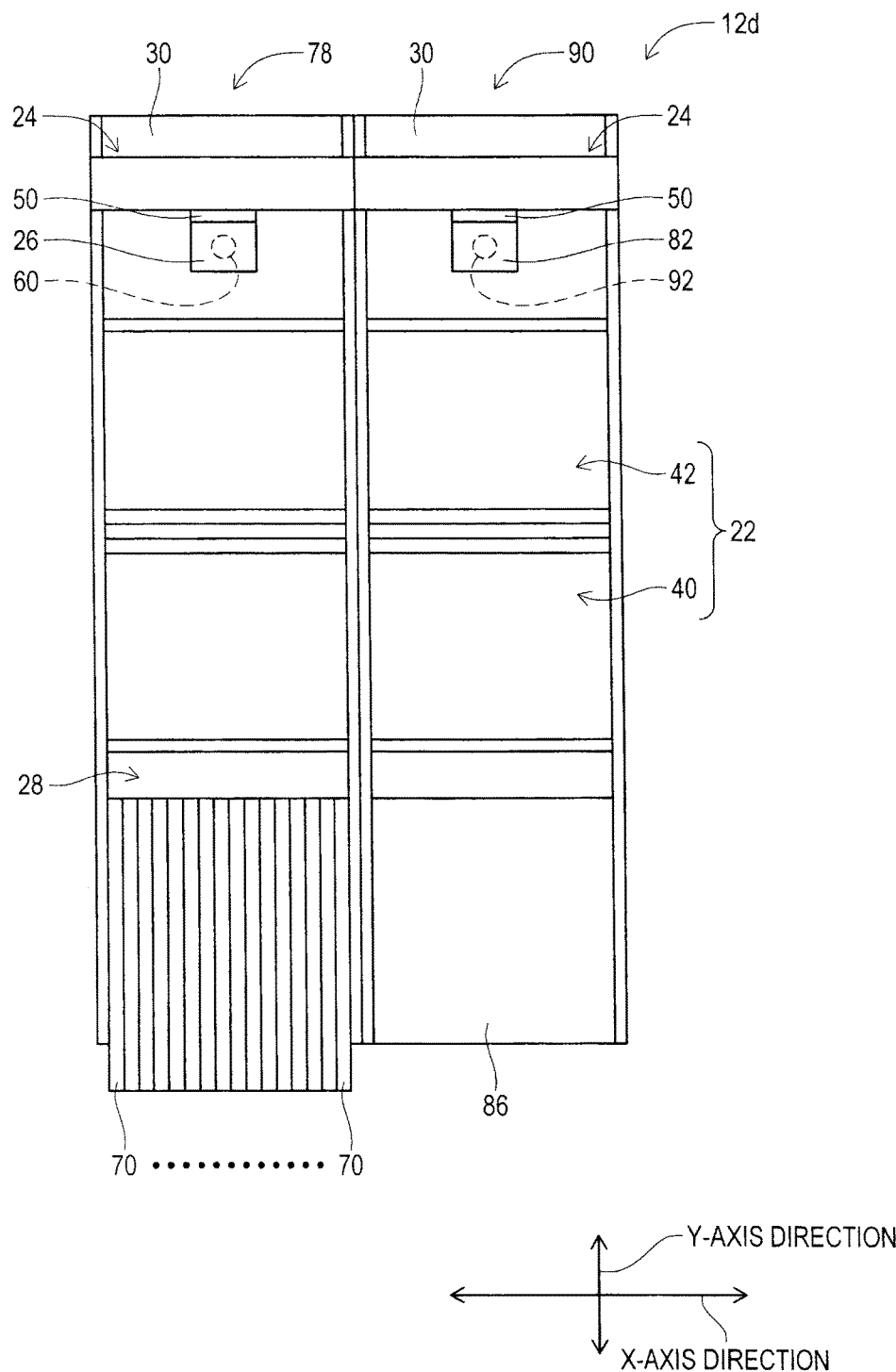
FIG. 5 is a top plan view illustrating the process apparatus formed of the mounting machine and a second inspection machine.

As illustrated in FIGS. 1 and 5, the process apparatus 12d has the system base 16; the second mounting machine 78; and a second inspection machine 90. The second mounting machine 78 and the second inspection machine 90 are provided on the system base 16 while being adjacent to each other, and the second inspection machine 90 is provided on a downstream side of the second mounting machine 78.

The second inspection machine 90 has the same configuration as the first inspection machine 80 of the process apparatus 12c. In the second inspection machine 90, instead of the first inspection camera 88, a second inspection camera 92 is attached to the inspection head 82. Similar to the first inspection camera 88, the second inspection camera 92 is attached to the lower surface of the inspection head 82 while facing downward, and captures a top view image of a circuit substrate. Image data of the second inspection camera 92 is processed by the image process device 86, and thereby inspection is performed related to the electronic components mounted on a circuit substrate. The number of pixels of the second inspection camera 92 is less than that of the first inspection camera 88, and the resolution of the second inspection camera 92 is lower than that of the first inspection camera 88; however, the visual field, that is, the imaging range of the second inspection camera 92 is wider than that of the first inspection camera 88.

Figure 6:
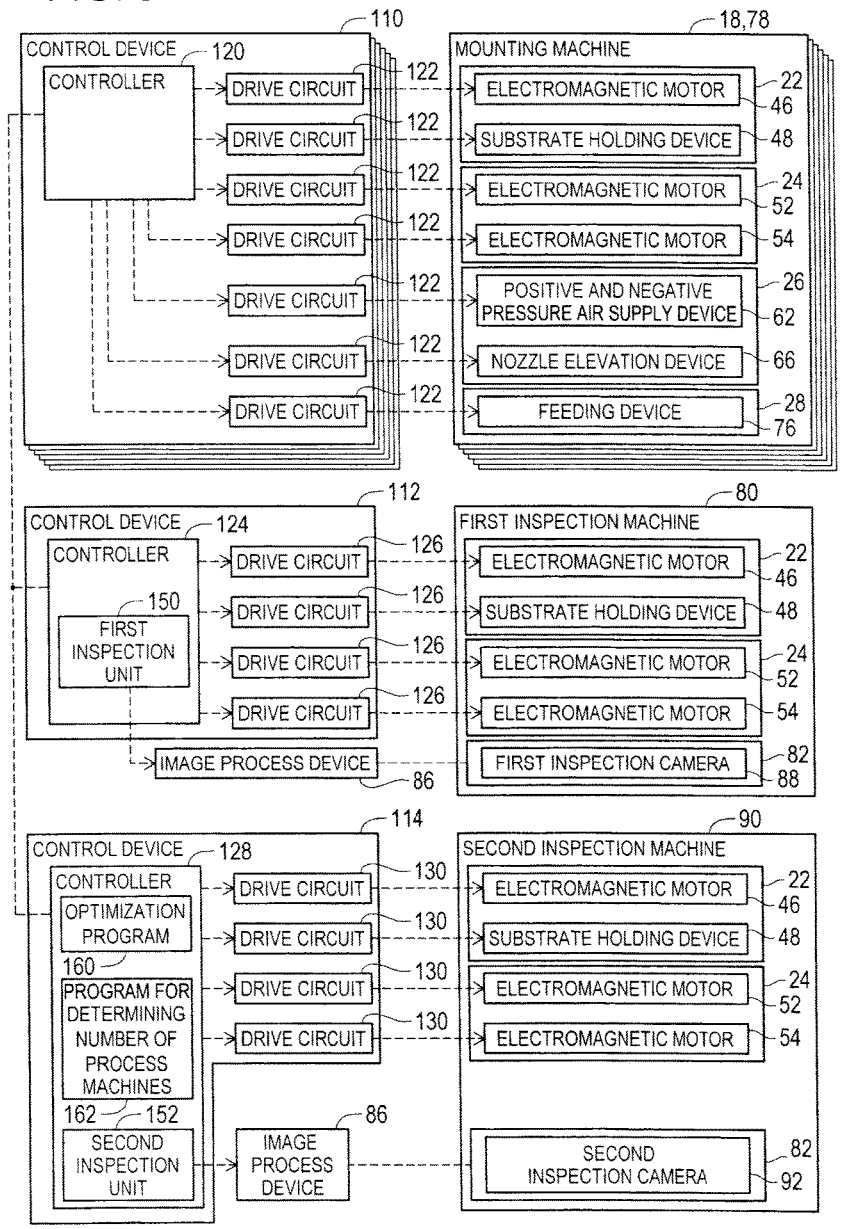
FIG. 6 is a block diagram illustrating a control device of each of the mounting machine, the first inspection machine, and the second inspection machine.

As illustrated in FIG. 6, the substrate process system 10 includes a plurality of control devices 110, 112, and 114 that are provided in such a manner so as to correspond to the first mounting machine 18 and the second mounting machine 78, the first inspection machine 80, and the second inspection machine 90, respectively. The control device 110, which is provided corresponding to the first mounting machine 18 and the second mounting machine 78, includes a controller 120 and a plurality of drive circuits 122. The plurality of drive circuits 122 are respectively connected to the electromagnetic motors 46, 52, and 54, the substrate holding device 48, the positive and negative pressure air supply device 62, the nozzle elevation device 66, and the feeding device 76. The controller 120 includes a CPU, a ROM, and a RAM, has a computer as a main body, and is connected to the plurality of drive circuits 122. Accordingly, the operation of each of the transportation device 22, the moving device 24, and the like is controlled by the controller 120.

The control device 112, which is provided corresponding to the first inspection machine 80, includes a controller 124 and a plurality of drive circuits 126. The plurality of drive circuits 126 are respectively connected to the electromagnetic motors 46, 52, and 54, and the substrate holding device 48. The controller 124 includes a CPU, a ROM, and a RAM, has a computer as a main body, and is connected to the plurality of drive circuits 126. Accordingly, the operation of each of the transportation device 22 and the moving device 24 is controlled by the controller 124. In addition, the image process device 86 is connected to the controller 124. Accordingly, the controller 124 acquires information relative to electronic components mounted on a circuit substrate.

The control device 114, which is provided corresponding to the second inspection machine 90, includes a controller 128 and a plurality of drive circuits 130. The plurality of drive circuits 130 are respectively connected to the electromagnetic motors 46, 52, and 54, and the substrate holding device 48. The controller 128 includes a CPU, a ROM, and a RAM, has a computer as a main body, and is connected to the plurality of drive circuits 130. Accordingly, the operation of each of the transportation device 22 and the moving device 24 is controlled by the controller 128. In addition, the image process device 86 is connected to the controller 128. Accordingly, the controller 128 acquires information relative to electronic components mounted on a circuit substrate.

<Operation of Substrate Process System>

In the substrate process system 10 having the above-mentioned configuration, a circuit substrate is transported from the first mounting machine 18 (the mounting machine being disposed on the most upstream side) to the second inspection machine 90 (the inspection machine being disposed on the most downstream side). The first mounting machine 18 and the second mounting machine 78 mount electronic components on the circuit substrate being transported, and the first inspection machine 80 and the second inspection machine 90 perform an inspection process.

Specifically, in the first mounting machine 18 disposed on the most upstream side, the circuit substrate is transported to a process position via an instruction from the controller 120 of the control device 110, and is fixedly held at that position. The supply device 28 supplies the electronic components at the supply position of the tape feeder 70. The controller 120 controls the mounting head 26 to move to a point above the supply position, and controls the suction nozzle 60 to suction and hold an electronic component. Subsequently, the mounting head 26 moves above the circuit substrate, and mounts the electronic components on the circuit substrate. Then, the circuit substrate having the mounted electronic components is transported to the first mounting machine 18 on a downstream side.

The above-mentioned mounting processes are sequentially performed in a plurality of the first mounting machines 18, and the circuit substrate having a plurality of the mounted electronic components is transported to the first inspection machine 80. As described above, the supply device 28 of the first mounting machine 18 supplies very small electronic components. For this reason, the circuit substrate is transported to the first inspection machine 80 while the very small electronic components are mounted thereon.

In the first inspection machine 80, the circuit substrate is transported to a process position via an instruction from the controller 124 of the control device 112, and is fixedly held at that position. The controller 124 controls the inspection head 82 to move to a point above the circuit substrate, and controls the first inspection camera 88 to capture a top view image of the circuit substrate. The image data is processed by the image process device 86, and thereby the controller 124 acquires information relative to the electronic components mounted on the circuit substrate. The controller 124 validates the mounting position of each of the electronic components, and inspects the existence and non-existence of each of the electronic components based on the information. Since the first inspection machine 80 adopts the first inspection camera 88 having a high resolving power, the first inspection machine 80 can properly inspect the very small electronic components.

When the first inspection machine 80 completes the inspection process, the circuit substrate is transported to the second mounting machine 78 of the process apparatus 12c. The second mounting machine 78 performs the same mounting process as the first mounting machine 18. Subsequently, the circuit substrate is transported to the second mounting machine 78 of the process apparatus 12d, and the second mounting machine 78 also performs the same mounting process as the first mounting machine 18. Then, the circuit substrate is transported to the second inspection machine 90.

The second inspection machine 90 also performs the same inspection process as the first inspection machine 80. Since the electronic components mounted by the first mounting machines 18 are inspected by the first inspection machine 80, the second inspection machine 90 inspects only the electronic components mounted by the second mounting machine 78. That is, the second inspection machine 90 inspects relatively large electronic components. The second inspection camera 92 of the second inspection machine 90 has a resolving power lower than that of the first inspection camera 88 of the first inspection machine 80; however, since the electronic components as inspection targets are relatively large, the second inspection machine 90 can properly perform the inspection process. Since images are captured by the second inspection camera 92 having a low resolving power, the time required for processing the image data is relatively short, and thereby it is possible to reduce an inspection time. In addition, since the imaging range of the second inspection camera 92 is relatively wide, the entirety of the electronic components mounted by the second mounting machine 78 can be inspected with a smaller number of times of imaging. Accordingly, it is possible to further reduce an inspection time.

As described above, in the substrate process system 10, the first inspection camera 88 having a high resolving power inspects very small electronic components. Accordingly, it is possible to inspect small components in detail. In contrast, relatively large electronic components are inspected using the second inspection camera 92 that has a low resolving power, but has a wide imaging range. Accordingly, it is possible to reduce an inspection time. As a result, in the substrate process system 10, it is possible to reliably inspect very small components, and to reduce an inspection time at the same time.

In the substrate process system 10, first, very small electronic components are mounted on a circuit substrate, and then the mounted very small electronic components are inspected. After the inspection of the very small electronic components is completed, relatively large electronic components are mounted on the circuit substrate, and then the large electronic components are inspected. That is, first, it is inspected whether the very small electronic components are properly mounted, and then, the large electronic components are mounted. Accordingly, it is possible to reliably prevent a very small electronic component from being placed below a large electronic component. In addition, since the very small electronic components are mounted prior to mounting of the large electronic components, it is possible to prevent the suction nozzle 60 or the like from interfering with the large electronic components while the very small electronic components are mounted.

As illustrated in FIG. 6, the controller 124 of the control device 112 of the first inspection machine 80 includes a first inspection unit 150. The first inspection unit 150 is a functional unit for inspecting very small electronic components. The controller 128 of the control device 114 of the second inspection machine 90 includes a second inspection unit 152. The second inspection unit 152 is a functional unit for inspecting electronic components larger than those inspected by the first inspection unit 150.

The controller 128 of the control device 114 of the second inspection machine 90 stores an optimization program 160 for optimizing a process procedure for each process machine. The optimization program 160 determines a process procedure for each of the first mounting machine 18 and the second mounting machine 78 so that the first inspection machine 80 can inspect very small electronic components and the second inspection machine 90 can inspect large electronic components. Specifically, the controller 128 stores various information such as the types of an electronic component, the number of electronic components, and the mounting position of an electronic component to be mounted on a circuit substrate. Due to the execution of the optimization program 160, the types of an electronic component, the number of electronic components, the mounting position of an electronic component (to be mounted on a circuit substrate), and the like are set in such a manner so as to equalize the process time between the first mounting machine 18 and the second mounting machine 78.

For example, when the substrate process system 10 has few very small electronic components to be mounted, and many large electronic components to be mounted, the process procedure for each of the mounting machines 18 and 78 may be set in order for the first mounting machine 18 to mount a part of the large electronic components. In such a case, inspection target components for each of the inspection machines 80 and 90 may be set in order for the first inspection machine 80 to inspect large electronic components so that the inspection time is equalized between the first inspection machine 80 and the second inspection machine 90.

Figure 7:
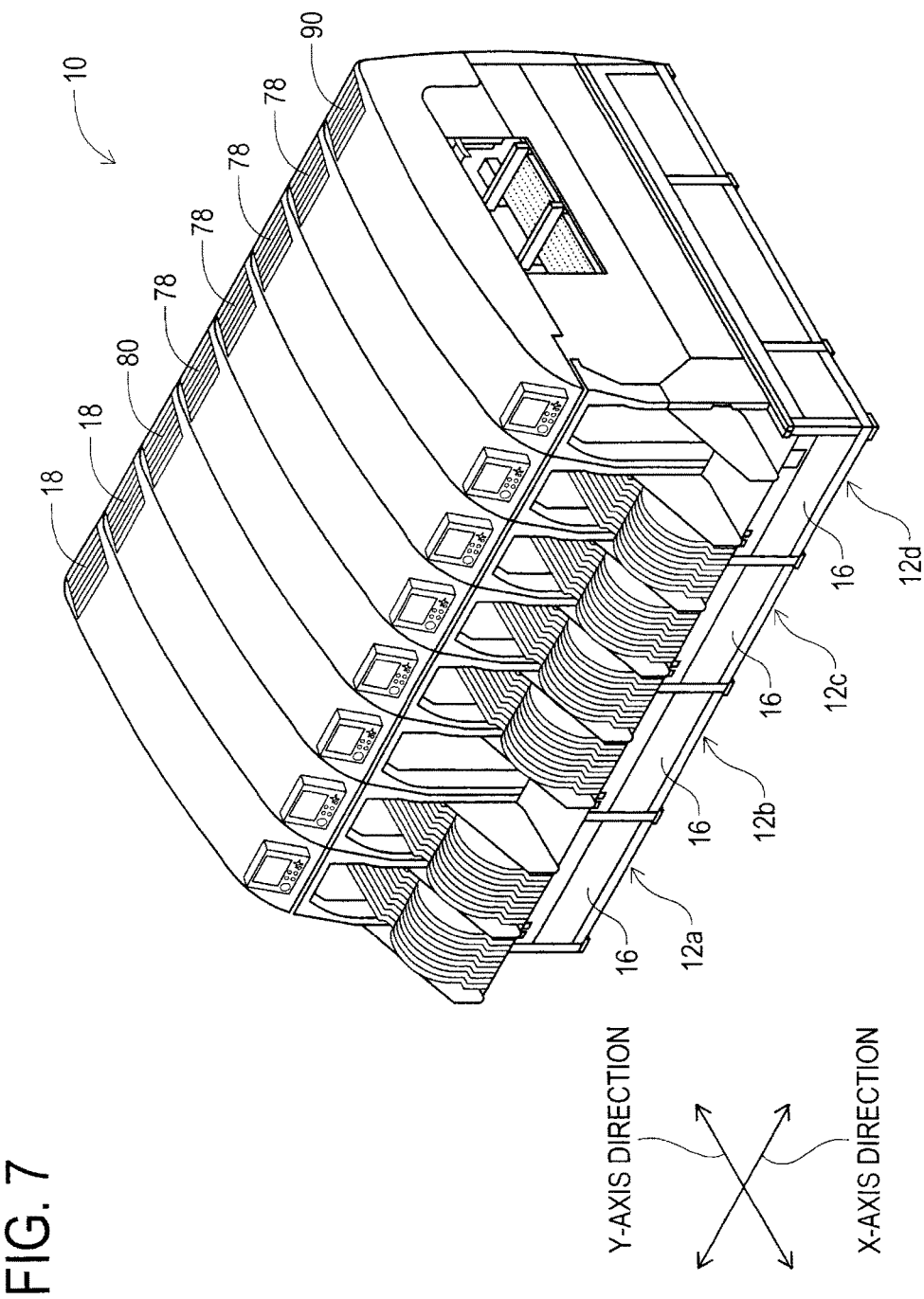
FIG. 7 is a perspective view illustrating a substrate process system that has a changed combination of the mounting machine, the first inspection machine, and the second inspection machine.

In the substrate process system 10, it is possible to transform each of the mounting machines 18 and 78, and each of the inspection machines 80 and 90 by replacing a process head and the like. For this reason, it is possible to change the combination of eight process machines (the first mounting machines 18, the second mounting machines 78, the first inspection machine 80, and the second inspection machine 90) of the substrate process system 10. Specifically, for example, when the substrate process system 10 has few very small electronic components to be mounted, and many large electronic components to be mounted, as illustrated in FIG. 7, it is possible to configure the substrate process system 10 to have two first mounting machines 18, four second mounting machines 78, one first inspection machine 80, and one second inspection machine 90.

As described above, the controller 128 of the control device 114 for the second inspection machine 90 stores a program 162 for determining the number of process machines. The program 162 for determining the number of process machines determines the number of each type of process machines based on the process time, that is, the so-called takt time of each process machine. Specifically, for example, in a case where the substrate process system 10 has few very small electronic components to be mounted, and many large electronic components to be mounted, when the takt time is set to be a predetermined time, a computational result shows that the substrate process system 10 requires two first mounting machines 18, one first inspection machine 80, four second mounting machines 78, and one second inspection machine 90. The substrate process system 10 illustrated in FIG. 7 is configured based on this computational result, and thereby it is possible to perform each process in the predetermined takt time.

Figure 8:
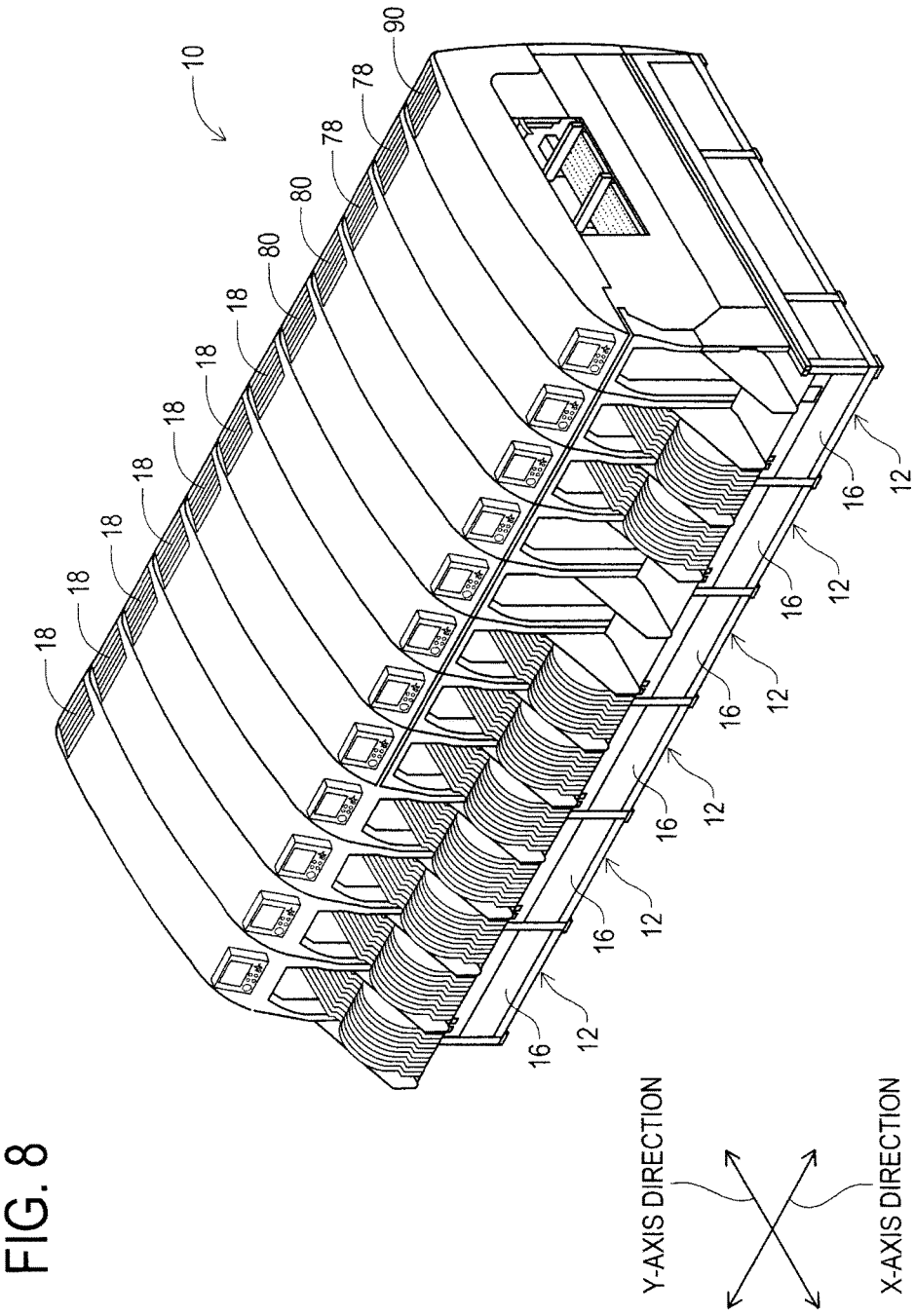
FIG. 8 is a perspective view illustrating a substrate process system that has a changed combination of the mounting machine, the first inspection machine, and the second inspection machine via the provision of the additional process apparatuses.

In addition, it is possible to provide additional process apparatuses 12 in the substrate process system 10. For example, as illustrated in FIG. 8, two process apparatuses 12 are provided in addition to the four process apparatuses 12 that are already provided in the substrate process system 10, and thereby it is possible to build the substrate process system 10 formed of six process apparatuses 12. Also in the substrate process system 10 formed of the six process apparatuses 12, it is possible to transform each of the mounting machines 18 and 78, and each of the inspection machines 80 and 90. For this reason, it is possible to freely set the combination of 12 process machines (the first mounting machines 18, the second mounting machines 78, the first inspection machines 80, and the second inspection machines 90) of the six process apparatuses 12.

For this reason, even when the computed number of process machines exceeds 8, it is possible to realize a system formed of 8 or more process machines by executing the program 162 for determining the number of process machines. Specifically, for example, in a case where the substrate process system 10 has many very small electronic components to be mounted, and few large electronic components to be mounted, when the takt time is set to be relatively short, a computational result shows that the substrate process system 10 requires seven first mounting machines 18, two first inspection machines 80, two second mounting machines 78, and one second inspection machine 90. The substrate process system 10 illustrated in FIG. 8 is configured based on this computational result, and thereby it is possible to perform each process in the relatively short takt time.

Modification Example

In the substrate process system 10, instead of each of the inspection machines 80 and 90, an inspection machine having a different structure can be provided. FIG. 9 illustrates an inspection machine 170 having a different structure, and hereinafter a description thereof will be given. The inspection machine 170 includes many devices having the same configuration as that of each of the inspection machines 80 and 90. For this reason, the same reference numbers are assigned to the devices having the same configuration as that of each of the inspection machines 80 and 90 and the description thereof is omitted or simplified.

The inspection machine 170 includes a moving device 172. The moving device 172 has a pair of Y-axis guide rails 174 that extends in the Y-axis direction, and a pair of X-axis guide rails 176 that extends in the X-axis direction. The pair of X-axis guide rails 176 are suspended above the pair of Y-axis guide rails 174. Each of the X-axis guide rails 176 moves to an arbitrary position in the Y-axis direction due to the drive of an electromagnetic motor (not illustrated). Each of the X-axis guide rails 176 holds a slider 178 that can move along its own axial line. The slider 178 moves to an arbitrary position in the X-axis direction due to the drive of an electromagnetic motor (not illustrated). Due to such a structure, each of two sliders 178 moves to an arbitrary position above a base 180.

The inspection head 82 is mounted on each of the two sliders 178. The first inspection camera 88 is attached to one of two inspection heads 82, and the second inspection camera 92 is attached to the other inspection head 82. The moving device 172 moves one of the two inspection heads 82 to a point above a circuit substrate transported by the conveyor device 40, and moves the other inspection head 82 to a point above a circuit substrate transported by the conveyor device 42. Accordingly, the inspection heads 82 capture an image of one or both of the circuit substrates transported by the conveyor devices 40 and 42. Two image process devices 86 are respectively provided on opposite side portions of the base 180 in the Y-axis direction in such a manner so as to correspond to the first inspection camera 88 and the second inspection camera 92 of the two inspection heads 82.

In the inspection machine 170 having the above-mentioned structure, the two inspection heads 82 capture images of the circuit substrates transported by the conveyor devices 40 and 42, respectively, and inspection processes are performed based on image data obtained by the two inspection heads 82. The inspection machine 170 is disposed on a downstream side of the first mounting machine 18 and the second mounting machine 78, and inspects very small electronic components and relatively large electronic components mounted on the circuit substrate.

Specifically, for example, when the circuit substrate is transported to the inspection machine 170, a control device (not illustrated) instructs the conveyor device 40 to transport the circuit substrate to a process position, and the circuit substrate is fixedly held at that position. The control device moves one (the inspection head having the first inspection camera 88 attached thereto) of the two inspection heads 82 to a point above the circuit substrate, and the first inspection camera 88 captures a top view image of the circuit substrate. The control device (not illustrated) controls the image process device 86 to process the image data, and controls the inspection machine 170 to inspect the electronic components mounted on the circuit substrate. The first inspection camera 88 captures images of the very small electronic components mounted on the circuit substrate. That is, the very small electronic components are inspected based on the image data obtained by the first inspection camera 88.

When the very small electronic components are completely inspected, the inspection head 82 having the second inspection camera 92 attached thereto moves to a point above the circuit substrate, and the second inspection camera 92 captures a top view image of the circuit substrate. That is, the second inspection camera 92 captures images of the relatively large electronic components mounted on the circuit substrate. Accordingly, the relatively large electronic components are inspected based on the image data obtained by the second inspection camera 92.

As such, in the inspection machine 170, the first inspection camera 88 having a high resolving power inspects the very small electronic components, and the second inspection camera 92 having a wide imaging range inspects the relatively large electronic components. Accordingly, in one inspection machine 170, it is possible to reliably inspect the very small components, and to reduce an inspection time at the same time.

In the example and the modification example, the substrate process system 10 is an example of the substrate process system. The first mounting machine 18, the second mounting machine 78, the first inspection machine 80, the second inspection machine 90, and the inspection machine 170 are examples of the process machine. The first mounting machine 18 is an example of a first mounting device. The second mounting machine 78 is an example of a second mounting device. The first inspection camera 88 is an example of an inspection device and a first inspection device. The second inspection camera 92 is an example of the inspection device and a second inspection device. The optimization program 160 is an example of a process procedure optimization program. The program 162 for determining the number of process machines is an example of a program for determining the number of process machines. The electronic component is an example of a mounting component.

The present disclosure is not limited to the example and the modification example, and modifications and improvements can be made to the example and the modification example in various forms based on the knowledge of persons skilled in the art. Specifically, for example, in the example, the plurality of process machines are arranged in the sequence of the first mounting machine 18, the first inspection machine 80, the second mounting machine 78, and the second inspection machine 90; however, the process machines may be arranged in a different sequence. Specifically, for example, the plurality of process machines are arranged in the sequence of the second mounting machine 78, the second inspection machine 90, the first mounting machine 18, and the first inspection machine 80. That is, a circuit substrate may be processed in the following sequence: process of mounting large electronic components; process of inspecting the large electronic components; process of mounting very small electronic components; and process of inspecting the very small electronic components. For example, the plurality of process machines may be arranged in the sequence of the mounting machine 18, the mounting machine 78, the inspection machine 80, and the inspection machine 90. That is, a circuit substrate may be processed in the following sequence: process of mounting very small electronic components; process of mounting large electronic components, process of inspecting the very small electronic components; and process of inspecting the large electronic components.

In the example, the optimization program 160 and the program 162 for determining the number of process machines are stored in the controller 128 of the control device 114; however, may be stored in another control device. That is, the optimization program 160 and the program 162 for determining the number of process machines may be stored in a control device that is installed independently from the substrate process system 10.

EXPLANATION OF REFERENCE

10: substrate process system
18: first mounting machine (process machine) (first mounting device)
78: second mounting machine (process machine) (second mounting device)
80: first inspection machine (process machine)
88: first inspection camera (inspection device) (first inspection device)
90: second inspection machine (process machine)
92: second inspection camera (inspection device) (second inspection device)
160: optimization program (process procedure optimization program)
162: program for determining the number of process machines.

The invention claimed is:

1. A device for optimizing a process procedure for each predetermined number of a plurality of arranged process machines in a substrate process system that includes the plurality of arranged process machines, and that processes a circuit substrate in such a manner that the circuit substrate is sequentially processed by the plurality of process machines while being transported from an upstream process machine to a downstream process machine among the plurality of process machines, wherein the plurality of process machines includes
   at least one first mounting device for mounting a first set of mounted components on the circuit substrate,
   at least one second mounting device for mounting a second set of mounted components on the circuit substrate, the second set of mounted components being larger than the first set of mounted components
   at least one first inspection device which inspects a mounting position of the first set of mounted components mounted on the circuit substrate by the at least one first mounting device, and
   at least one second inspection device which inspects a mounting position of the second set of mounted components mounted on the circuit substrate by the at least one second mounting device,
wherein the at least one first inspection device is disposed on a downstream side of the at least one first mounting device, the at least one second mounting device is disposed on a downstream side of the at least one first inspection device, and the at least one second inspection device is disposed on a downstream side of the at least one second mounting device,
wherein the at least one first inspection device has a resolving power higher than that of the at least one second inspection device, wherein the higher resolving power of the at least one first inspection device requires a relatively longer time to process images of the mounted positions of the first set of mounted components as compared with the time to process images of the mounted positions of the second set of mounted components of the at least one second inspection device, and
wherein the device for optimizing the process procedure is configured to allocate a process to each of the plurality of process machines in such a manner that the at least one first inspection device only inspects the mounting position of the first set of mounted components mounted on the circuit substrate by the at least one first mounting device, the at least one second inspection device only inspects the mounting position of the second set of mounted components mounted on the circuit substrate by the at least one second mounting device, the second set of mounted components being larger than the first set of mounted components, and an inspection time for the at least one first inspection device and an inspection time for the at least one second inspection device are equalized based on at least one of type, number, and mounting position of the mounted components of the first set of mounted components, at least one of type, number, and mounting position of the mounted components of the second set of mounted components, and the relatively longer time to process images of the mounted positions of the first set of mounted components due to the higher resolving power of the at least one first inspection device.

2. The substrate process system according to claim 1, wherein the at least one first and second mounting machines each includes a mounting head on which a suction nozzle is mounted, and a supply device which supplies the components to be mounted and which is mounted to a frame portion of the respective mounting machine, and
   wherein the mounting heads of the at least one first and second mounting machine are each interchangeable with the first inspection head of the at least one first inspection device, and are each interchangeable with the second inspection head of the at least one second inspection device.

* * * * *